(12) United States Patent
White et al.

(10) Patent No.: US 10,505,528 B1
(45) Date of Patent: Dec. 10, 2019

(54) DETERMINISTIC SHUTDOWN OF POWER MODULE (71) Applicant: Apple Inc., Cupertino, CA (US)

(72) Inventors: Paul M. White, Sunnyvale, CA (US); Javier Ruiz, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/108,526

(22) Filed: Aug. 22, 2018

Related U.S. Application Data (60) Provisional application No. 62/559,912, filed on Sep. 18, 2017.

(51) Int. Cl.
H03K 17/08 (2006.01)
H03K 17/14 (2006.01)
(52) U.S. Cl.
CPC ........... *H03K 17/08* (2013.01); *H03K 17/145* (2013.01); *H03K 2017/0806* (2013.01)
(58) Field of Classification Search
CPC .............................. H03K 17/08; H03K 17/145
See application file for complete search history.

(56) References Cited

U.S. PATENT DOCUMENTS

2012/0242376 A1\* 9/2012 Ose .................... H03K 17/0828
327/109

\* cited by examiner

*Primary Examiner* — Daniel C Puentes
(74) *Attorney, Agent, or Firm* — Kilpatrick Townsend & Stockton (57) ABSTRACT

Power semiconductor devices according to embodiments of the present technology may be operated to protect components of the semiconductor device. Methods for operation of the devices may include measuring a temperature within a source region of the semiconductor device. The methods may include measuring at the semiconductor device an amount of current associated with a short circuit external to the semiconductor device. The methods may include predicting a temperature effect within two regions of the semiconductor device based on a range of distribution of the amount of current between the two regions of the semiconductor device. The methods may include determining a particular distribution of the amount of current between the two regions of the semiconductor device. The methods may also include shutting off the semiconductor device to cause the particular distribution of current between the two regions of the semiconductor device.

10 Claims, 4 Drawing Sheets

DETERMINISTIC SHUTDOWN OF POWER MODULE

CROSS-REFERENCE TO RELATED APPLICATION

This application claims the benefit of U.S. Application Ser. No. 62/559,912, filed Sep. 18, 2017, the entire disclosure of which is hereby incorporated by reference for all purposes.

TECHNICAL FIELD

The present technology relates to power modules and operation of power modules. More specifically, the present technology relates to operating a semiconductor device to control switching loss distribution after an external short circuit.

BACKGROUND

An external short circuit can expose a semiconductor device to tens or hundreds of times the standard operating current. When the device is switched off in response, energy release within the device may cause localized heating that may be substantial enough to damage the device.

SUMMARY

Power semiconductor devices according to embodiments of the present technology may be operated to protect components of the semiconductor device. Methods for operation of the devices may include measuring a temperature within a source region of the semiconductor device. The methods may include measuring at the semiconductor device an amount of current associated with a short circuit external to the semiconductor device. The methods may include predicting a temperature effect within two regions of the semiconductor device based on a range of distribution of the amount of current between the two regions of the semiconductor device. The methods may include determining a particular distribution of the amount of current between the two regions of the semiconductor device. The methods may also include shutting off the semiconductor device to cause the particular distribution of current between the two regions of the semiconductor device.

In some embodiments, the temperature may be measured proximate a gate structure of the semiconductor device. The methods may further include identifying a time rate of current change (dI/dt) associated with the determined particular distribution of the amount of current between the two regions of the semiconductor device. The methods may also include driving the semiconductor device in a pattern corresponding to the identified dI/dt. The two regions of the semiconductor device may include a JFET region and an avalanche region of the semiconductor device. The range of distribution may extend from 0% to 100% delivery within the JFET region of the semiconductor device. The methods may also include determining whether the particular distribution delivers an amount of current to the avalanche region of the semiconductor device above a threshold predetermined to cause latchup of the semiconductor device. The amount of current to the avalanche region may be determined to be at or above the predetermined threshold in some embodiments, and the methods may also include adjusting the particular distribution to set the amount of current delivered to the avalanche region at or below the predetermined threshold.

The present technology also encompasses power modules which may include a direct bonded copper substrate. The modules may also include a plurality of switches overlying the direct bonded copper substrate. The modules may also include a flexible circuit board overlying the direct bonded copper substrate. The flexible circuit board may define an aperture through the flexible circuit board for each switch of the plurality of switches. The plurality of switches may extend through corresponding apertures of the flexible circuit board. A current sensor may extend about each aperture, and the current sensors may be configured to measure current through each switch of the plurality of switches.

In some embodiments the power modules may also include an additional direct bonded copper substrate overlying the flexible circuit board. The additional direct bonded copper substrate may contact a surface of each switch extending through the apertures of the flexible circuit board. Each switch of the plurality of switches may include a temperature sensing diode formed proximate a gate structure of the switch. The power modules may also include an integrated circuit coupled with the flexible circuit board and configured to model a temperature distribution within each switch. The model may determine a temperature effect within each switch based on a switching loss current distribution.

The integrated circuit may be configured to select a dI/dt by which an individual switch of the plurality of switches is configured to shut off to distribute current within regions of the switch. The integrated circuit may also include a selective gate drive electronically coupled with the current sensors and configured to drive a gate of a switch of the plurality of switches to a setpoint configured to provide a predetermined distribution of current within the switch. Each switch of the plurality of switches may include a gate pad, a source pad, and a temperature pad communicatively coupled with a diode formed within the source pad. The current sensors may be or include Rogowski coils positioned in plane with the plurality of switches extending through the apertures.

The present technology also encompasses non-transitory computer-readable mediums comprising sequences of instructions which, when executed by one or more processors, may cause the one or more processors to perform operations. The operations may include measuring a temperature within a source region of a semiconductor device. The operations may include measuring at the semiconductor device an amount of current associated with a short circuit external to the semiconductor device. The operations may include predicting a temperature effect within two regions of the semiconductor device based on a range of distribution of the amount of current between the two regions of the semiconductor device. The operations may include determining a particular distribution of the amount of current between the two regions of the semiconductor device. The operations may include identifying a time rate of current change (dI/dt) associated with the determined particular distribution of the amount of current between the two regions of the semiconductor device. The operations may also include driving the semiconductor device in a pattern corresponding to the identified dI/dt.

In some embodiments, the operations may also include determining whether the particular distribution delivers an amount of current to an avalanche region of the semiconductor device above a threshold predetermined to cause latch-up of the semiconductor device. When the amount of current to the avalanche region is determined to be at or above the predetermined threshold, the processors are further caused to perform the operation of adjusting the particular distribution to set the amount of current delivered to the avalanche region at or below the predetermined threshold.

Such technology may provide numerous benefits over conventional technology. For example, the present devices may provide increased lifetime over conventional devices. By distributing current within the semiconductor device, temperature hotspots within the device may be reduced. Additionally, the designs may improve survivability of exemplary devices from external short circuit events. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Power semiconductor devices, such as power MOSFETS, are a valuable switch due to the high switching speed and the relatively high efficiency at voltages below 250 V, and may also be used above 250V as well. The power MOSFET can be used with many types of loads exhibiting high inrush currents, such as drives, motors, and DC devices. However, during short circuiting of the device being switched, switching losses much above normal operating switching losses must be distributed in the semiconductor device when the switch is turned off. For example, a switch that operates at currents of around 100 amps under standard conditions may be exposed to tens or hundreds of thousands of amps during a short circuit. Although a power semiconductor device may switch off quickly, switching losses may be distributed through the device causing localized hot spots of between 200° C. to upwards of 1,200° C. Depending on the location of the energy dissipation, fragile oxides or other materials may be affected even during events that occur over a fraction of a second.

Many conventional devices may operate in one or two switching modes in which a protection circuit opens the switch in one of two ways. During a soft turn-off, the semiconductor device may be switched off at a fixed speed, which may distribute a majority of losses near the gate, and which may cause tunneling that can reduce device lifetime. Alternatively, the semiconductor device may be switched off quickly, causing an increase in voltage that may be dissipated through avalanche. However, above a threshold of avalanche, the parasitic bipolar junction transistor (BJT) may cause latchup in the power MOSFET causing the device to fail.

The present technology may overcome these issues by providing device level temperature and current sensing, and operating an observer to predict temperature gains through the semiconductor device. Additionally, controls associated with the device may utilize this modeling to control switching operation to distribute energy between the regions and limit damage, which may increase operational life of the semiconductor device. After describing the distribution characteristics through an exemplary device, the present technology will be described both by the operational characteristics of the technology as well as with exemplary devices according to some embodiments of the present technology.

Figure 1:
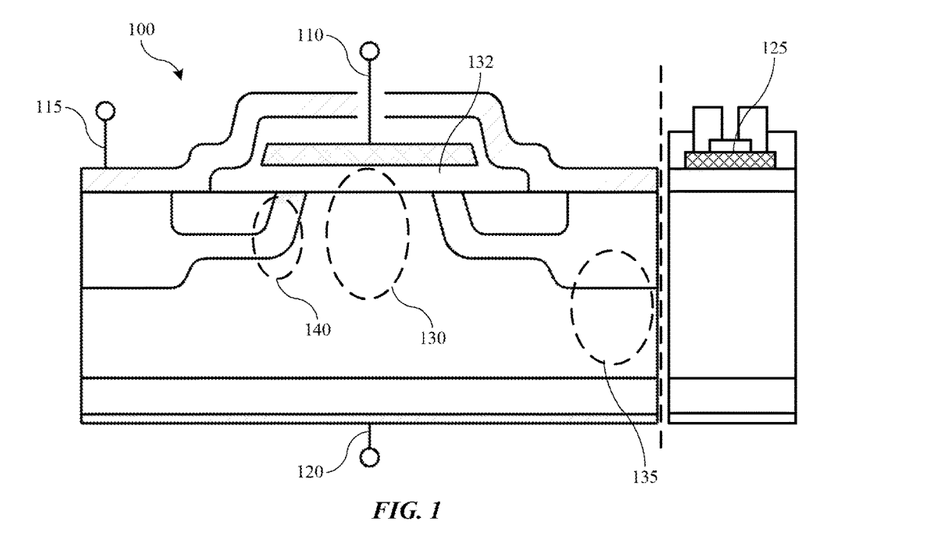
FIG. 1 shows a schematic cross-sectional view of a semiconductor device according to some embodiments of the present technology.

FIG. 1 shows a schematic cross-sectional view of cell structure of a semiconductor device 100 according to some embodiments of the present technology. An integrated thermal sense diode is also included within this cross-section as will be discussed. Semiconductor device 100 is illustrated as a vertical DMOS structure or power MOSFET. It is to be understood, however, that various other switching configurations may be used in some embodiments of the present technology including other transistor structures such as insulated-gate bipolar transistors, power bipolar transistors, or thyristors. Semiconductor device 100 may include multiple cell structures of varying complexity, and may include hundreds or thousands of such cells. Regardless of the device configuration, the structure may include a gate 110, as well as source region 115 and drain region 120. As would be understood, when planar configurations are utilized for the semiconductor device, the source and drain may be positioned on sides of the gate structure.

Positioned in the source region of some cells, and as illustrated as laterally offset from the transistor, may be a sensor 125. Sensor 125 may be a temperature sensor that is used in the present technology to provide real-time measurements of temperature within the device, as well as to facilitate modeling of temperature distribution through the semiconductor device 100 as will be explained further below. Sensor 125 may be any number of thermal sensors. For example, sensor 125 may be a diode formed within oxide layers of the semiconductor device 100 structure. In other embodiments, sensor 125 may be or include a thermistor wired through the device, such as within the active region. However, by utilizing a sensor formed within oxide, such as a diode, incorporation may be facilitated in small-scale devices. As will be explained in more detail below, sensors 125 may not be associated with every cell of the semiconductor device 100, although one or more sensors may be distributed across source pads of a device structure, which may be used by the present technology to model temperatures throughout the semiconductor device structure.

Many conventional technologies may include a thermistor associated with the module that may be offset from the semiconductor device by a few millimeters. Due to the distance from the transistor structure, temperature measurements may be attenuated. During normal operation this attenuation may be a difference of several degrees, however the timescale of operation, which may be seconds or more, may allow temperature to be monitored based on an offset from the actual reading. During an event such as an external short, when the semiconductor device is switched off, the energy distribution may occur in less than 10 microseconds, which may raise temperatures within the device almost exponentially by several hundred degrees. A thermistor positioned further away may be incapable of registering such an event, rendering it essentially useless for protection of the transistor structure. By incorporating sensor 125 at a distance to the cell of less than or about 1 mm, less than or about 750 μm, less than or about 500 μm, less than or about 250 μm, less than or about 100 μm, less than or about 50 μm, less than or about 10 μm, or less, sensor 125 may register temperatures of the cell structures of semiconductor device 100 more accurately during fast-occurring events. This may enable aspects of the present technology to facilitate distribution of energy within the cell more efficiently.

The transistor structure of semiconductor device 100 may be characterized by multiple regions in which excess energy may be deposited. For example, when semiconductor device 100 is switched off, an amount of energy may be stored in the parasitic inductance that is then distributed within the module. That energy may be distributed in multiple regions as previously noted. For example, during a soft turn-off, the energy may be distributed into the JFET region 130 near the gate 110. During an external short circuit, the amount of energy may be many times what is released during standard switching, and the temperature may rise several hundreds of degrees in a number of microseconds. If the full amount of energy is distributed into the JFET region 130, tunneling may occur in the gate oxide 132 proximate the gate 110. Over time, these events can cause malfunction or failure of the switch. On the other hand, during a quick turn-off, the energy may be distributed into the body 135 or avalanche region. However, the avalanche region may be in close proximity to the parasitic BJT 140. Accordingly, if the amount of energy distributed in this region exceeds a threshold, latchup of the semiconductor device may occur. Because an event may occur in a matter of microseconds, the amount of time for distribution may be limited. However, using embodiments of the present technology, distribution of energy may be performed to protect both regions of the semiconductor device, which may reduce the exposure temperatures and increase useful life of the device.

Figure 2:
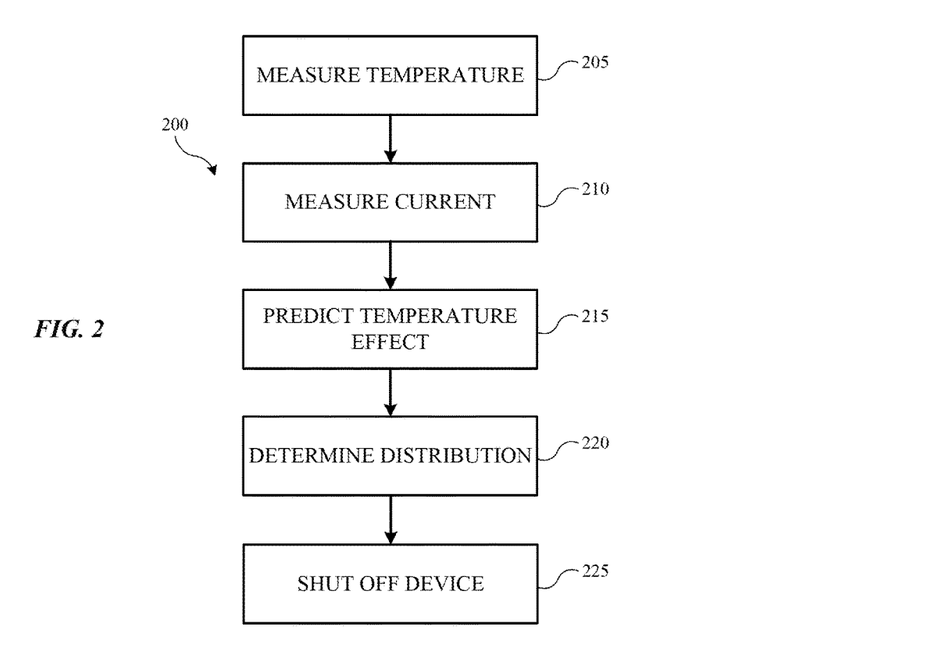
FIG. 2 illustrates exemplary operations in a method of operating a power semiconductor device according to some embodiments of the present technology.

FIG. 2 illustrates exemplary operations in a method 200 of operating a power semiconductor device according to some embodiments of the present technology. The power semiconductor device may be a variety of power modules as previously noted, such as an inverter power module that can include semiconductor devices 100 previously described. Method 200 may be used to operate a power module including one or more semiconductor switches, as well as a controller associated with the power module as will be discussed below. Method 200 may be performed by a dedicated controller such as an integrated circuit of the power module, or may be performed by a separate microprocessor-implemented series of instructions stored on a computer-readable medium. For example, a control system may be in communication with a power module according to some embodiments of the present technology, and may cause the operations of method 200 to be performed by the power module. The controller may be used to receive information from the semiconductor switch or switches, and may then operate to determine a scheme for shutting off the switch to efficiently or protectively distribute energy within the semiconductor structure.

Method 200 may include measuring a temperature within a source region of the semiconductor device at operation 205. The temperature may be received from a sensor proximate a gate structure of a transistor of the semiconductor device. The method may also include measuring an amount of current at the semiconductor device at operation 210. The amount of current may be associated with a short circuit that occurs external to the semiconductor device, such as with a motor or drive associated with the semiconductor device. For example, when drives are started in open environments, the drive may be exposed to moisture or humidity in the environment, which may cause a short between motor terminals. The generated heat may remove the moisture allowing startup on subsequent operation, however, the short that occurred may produce energy to be distributed within the switch of the power module. Hence, in some embodiments, short circuiting of an external device associated with the module and incorporated semiconductor devices may occur with a certain amount of regularity. Because of the amount of energy produced during each event, repeated heat generation within the semiconductor devices may cause damage over time.

The current produced during an event may be measured by a sensor positioned with the semiconductor device, and may correspond to switching losses that may be associated with the semiconductor device, which may be a switch in some embodiments. For modules in which multiple semiconductor devices may be included, multiple sensors may be utilized. With the measured temperature and the measured current, method 200 may include predicting a temperature effect within one or more regions of the semiconductor device at operation 215. The prediction may be based at least in part on a range of distribution of the amount of current within the one or more regions, such as between two or more regions, of the semiconductor device.

The prediction may be performed in any number of ways including by performing a model or lookup of distributions and associated temperature effects. Although sensors may not be positioned throughout all regions of the semiconductor device, an observer may determine effects within the semiconductor device based on different current distributions. An example of an observer is illustrated below in FIG. 4, and will be described in detail there. The model in operation may simulate distributions between regions, such as between the JFET region and the avalanche region previously described, and the temperature effect for each distribution. These temperature effects may be compared to reliability data for the semiconductor device to determine potential effects on lifetime operation or failure potential. In some embodiments the model may have been pre-run, and a database of potential scenarios and outcomes may be available within the module incorporating the semiconductor device. For example, for each temperature across a range of temperatures of the semiconductor device, energy distributions may be available that estimate temperature effects within regions of the semiconductor device for each region, at each of a range of currents, and across a range of distributions.

Based on the lookup or predictive modeling, the module may determine a particular distribution of current between the regions of the semiconductor device at operation 220. The available range of distribution may extend from 0% to 100% distribution of energy within the JFET region of the semiconductor device, and may include any smaller range within this range. Accordingly, the distribution may distribute all energy within the JFET region, all energy within the avalanche region, or some distribution between the two. For example, under cold operating conditions, such as cold start-up of a drive associated with the power module, the energy distribution from a short of the drive may be distributed entirely within the JFET region, as the rise in temperature from the cold-start temperature may still be below a threshold to cause significant damage to the gate structure of the semiconductor device.

Once the particular distribution of energy within the semiconductor device has been determined, the semiconductor device may be shut off in a manner to cause the particular distribution of energy between the regions to occur at operation 225. As power MOSFETs may be capable of operating at switching speeds in terms of nanoseconds, the model may be performed within a time window sufficient to allow operation of the switch and distribution of the current during the event creating the energy, which may occur on a timescale of microseconds, for example. By performing a distribution of energy, the temperature gain in each area may be reduced, which may reduce damage within regions of the semiconductor components.

Figure 3:
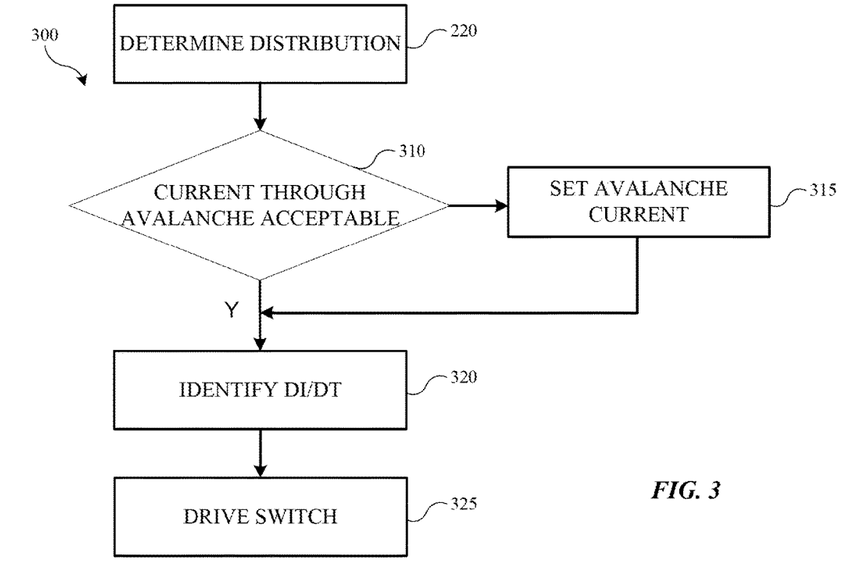
FIG. 3 illustrates additional exemplary operations in a method of operating a power semiconductor device according to some embodiments of the present technology.

FIG. 3 illustrates additional exemplary operations in a method 300 of operating a power semiconductor device according to some embodiments of the present technology. Method 300 may be performed in conjunction with method 200, and may provide additional operations that may be included in method 200. As previously explained, distribution of energy into the avalanche region may be limited by a threshold in which latchup of the MOSFET may occur. Latchup may occurs when an internal short forms within the structure in the parasitic BJTs creating a self-sustaining low resistance path, which may effectively latch the switch on, leading to malfunction or device failure.

Accordingly, to protect against this phenomenon, method 300 may ensure that the distribution of current or energy into the avalanche region remains below a threshold that may risk or cause latchup to occur. As illustrated in the figure, method 200 may operate to determine a particular distribution of current between regions of a semiconductor device at operation 220, such as, for example, a JFET region and an avalanche region of a semiconductor switch. At operation 310, a decision may be made to determine whether the particular distribution delivers an amount of current to the avalanche region of the semiconductor device above a threshold predetermined to cause latchup of the switch. The current threshold may be based on predetermined reliability data from a manufacturer, or may be based on failure testing of power modules including switches or other semiconductor devices.

If the amount of current is determined to be acceptable, the switch may be shut off as previously discussed. However, when the amount of current determined to be delivered to the avalanche region is above the threshold, the determined distribution may be adjusted to protect the semiconductor device. For example, the module may adjust the distribution to set the amount of current delivered to the avalanche region at or below the predetermined threshold for causing latchup at operation 315. After the distribution of current is set, or adjusted, the semiconductor device may be shut off. The shutoff operations may include driving the switch to cause the particular distribution to occur. For example, by modulating the time rate of current change (dI/dt) from slower to faster speeds, the amount of current distributed to the JFET region can be reduced. While slower dI/dt of the switch may provide increased distribution to the JFET region, faster dI/dt may increase the distribution to the transistor body and avalanche region.

Hence, once the power module has determined the particular distribution, with consideration of the amount of avalanche current as noted above, the module may identify a dI/dt associated with the particular distribution of the amount of current between the two regions of the semiconductor device at operation 320. Subsequently, the module may apply the dI/dt and drive the switch or semiconductor device in a pattern according to the identified dI/dt at operation 325. By adjusting the distribution of energy within the semiconductor device, some embodiments of the present technology may reduce temperatures delivered into the JFET region of the semiconductor device by at least about 50° C. while distributing residual energy into the avalanche region. Additionally, some embodiments of the present technology may reduce temperatures in the JFET region associated with an external short by at least or about 100° C., at least or about 110° C., at least or about 120° C., at least or about 130° C., at least or about 140° C., at least or about 150° C., at least or about 160° C., at least or about 170° C., at least or about 180° C., at least or about 190° C., at least or about 200° C., or more depending on the amount and distribution of current performed by the module.

Figure 4:
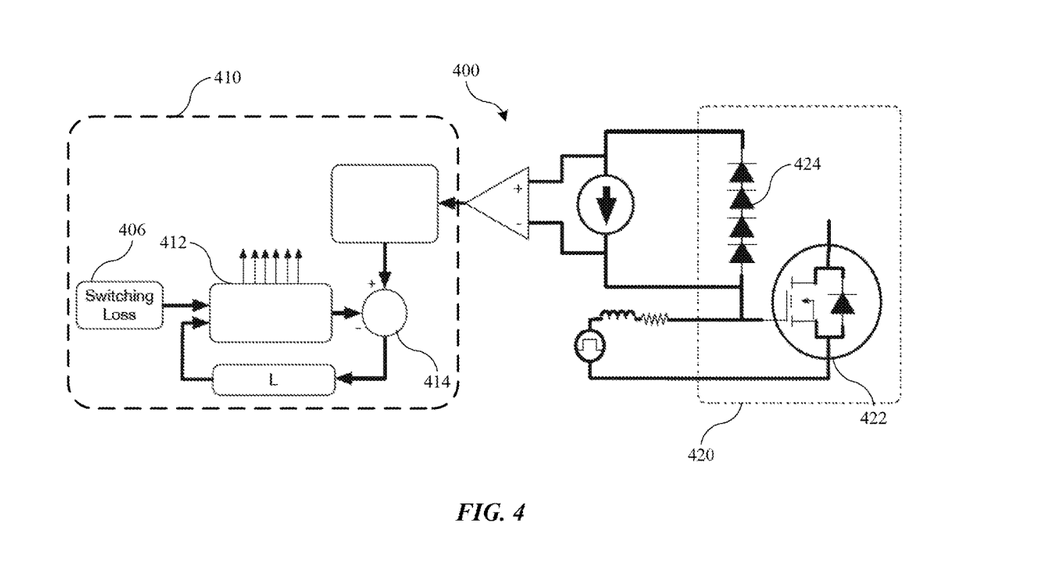
FIG. 4 shows a schematic diagram of an observer operating in conjunction with a semiconductor device according to some embodiments of the present technology.

FIG. 4 shows a schematic diagram of an exemplary module 400 including an integrated circuit module 410 operating in conjunction with a semiconductor device 420 according to some embodiments of the present technology. It is to be understood that module 400 includes one of a variety of configurations that may be used in embodiments of the present technology to perform operations and switching as discussed throughout the disclosure. Semiconductor device 420 may be or include a die having one or more cell transistor structures 422 defined across or throughout the structure. For example, the semiconductor device 420 may be or include a power MOSFET. Additionally, one or more temperature sensors, such as diodes 424 may be used to measure or collect temperature readings across the semiconductor device 420.

The measurements sensed from diodes 424 may be converted into temperature readings within circuit module 410. Switching losses may also be calculated by circuit module 410 in any number of ways, including by measuring dI/dt for device 420, and integrating dI/dt with voltage to determine switching losses associated with current from an external short as previously described. These temperature readings and current readings may be used by the circuit module with an observer 412 to model or predict temperature effects through the device that may be caused by distribution of the energy from the switching losses as previously described. Because temperature cannot be efficiently or economically measured at all locations across the semiconductor device 420, especially within active regions of each cell, the observer allows a virtual model to be produced to predict temperatures throughout the semiconductor device.

The switching losses 406 may be measured and continuously delivered to the observer. In this way, switching losses 406 may be measured in real time when an external short has occurred, and this energy can be utilized in the observer 412 to predict temperature effects throughout the semiconductor device and determine a distribution of energy between regions of the transistor structure and associated temperature gains in the regions. For each prediction, the actual measured die temperatures can be used in a comparator 414 as feedback for the prediction as an output to the model, which can be iterated until a suitable distribution of energy within the semiconductor device has been determined. In this way, temperature predictions can be produced for the semiconductor device without requiring direct measurements at every particular location through the structure.

Figure 5:
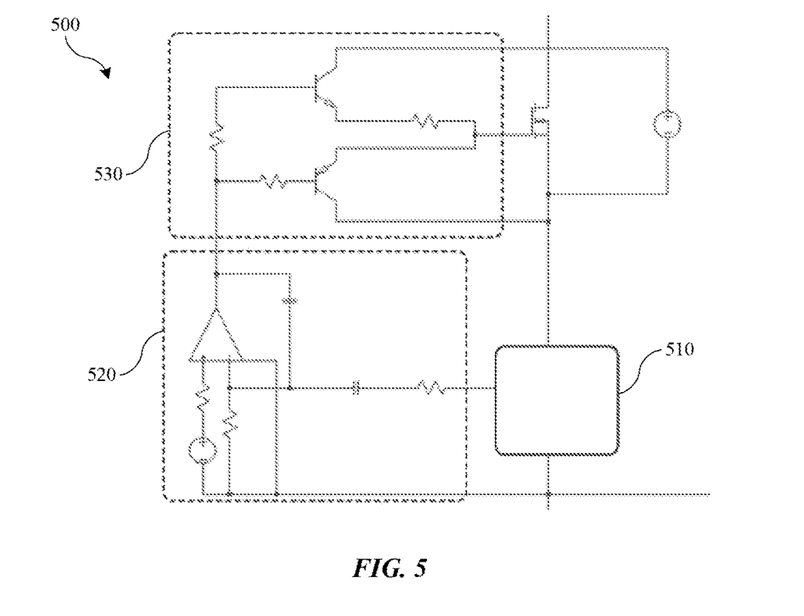
FIG. 5 shows a schematic diagram of switching circuitry according to some embodiments of the present technology.

FIG. 5 shows a schematic diagram of switching circuitry 500 according to some embodiments of the present technology. Circuitry 500 may represent one possible design for a selective gate drive circuit, which may be implemented with the present technology. It is to be understood that alternative circuitry or controls may be implemented that allow control over driving the gate during switching according to the previously described methods of modulating switching. Circuitry 500 may include a current sensor 510, which may measure the current through the semiconductor device. The controller previously described may calculate dI/dt from the measured current and provide that to a limiter 520. The limiter 520 may fix the dI/dt of the gate drive to remain at or below the determined level. This may then cause power stage 530 to drive the gate of the transistor structure or semiconductor device to a particular setpoint, which may provide the determined energy distribution within the semiconductor device. It is to be further understood that FIG. 5 is included for explanation purposes only, and is not intended to limit the structures encompassed by the present technology.

Figure 6:
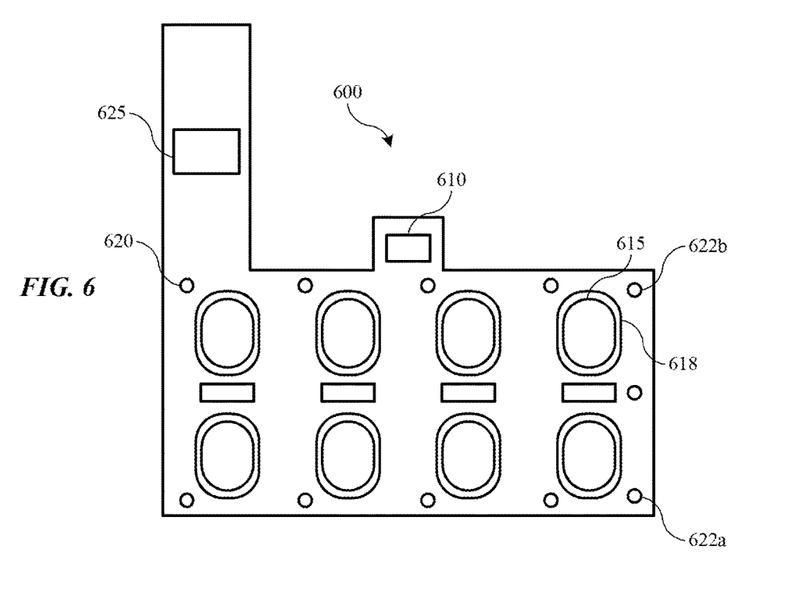
FIG. 6 shows a schematic plan view of a flexible circuit board according to some embodiments of the present technology.

Turning to FIG. 6 is shown a schematic plan view of a flexible circuit board 600 according to some embodiments of the present technology. Circuit board 600 may be characterized by a variety of shapes and sizes to accommodate power modules according to some embodiments of the present technology. As illustrated, circuit board 600 may include sensors and structures for operating semiconductor devices as previously described. For example, circuit board 600 may include a current IC 610, which may be a Hall sensor, which operates to measure current for a power module in which the flexible circuit board 600 is incorporated. The circuit board 600 may include one or more apertures 615 defined in the structure of the circuit board 600 to receive switches or semiconductor devices as previously described. Each aperture may include an associated sensor 618 extending about the aperture to measure current associated with switches extending through the apertures.

In some embodiments, sensors 618 may be Rogowski coils, which may allow thinner profiles of the flex board while measuring current for each switch. Gate bumps 620 may be included for providing contact with associated dies for the semiconductor devices. Circuit board 600 may also include voltage terminals 622a, 622b to provide voltage sensing capabilities. Flex circuit board 600 may also include an ASIC 625, which may be used to drive the switches off based on a particular dI/dt calculated to provide an energy distribution within the cells as previously described. In some embodiments, the ASIC 625 may model or facilitate modeling of a temperature distribution within each switch based on the measured temperature and switching losses as the current may be distributed within each switch. Accordingly, the ASIC 625 may be or include a microprocessor communicatively coupled with a database and memory including instructions for operations of the methods described above. The ASIC 625 may drive a gate of each switch to a setpoint configured to provide a distribution of current within each switch as selected by the model.

Figure 7:
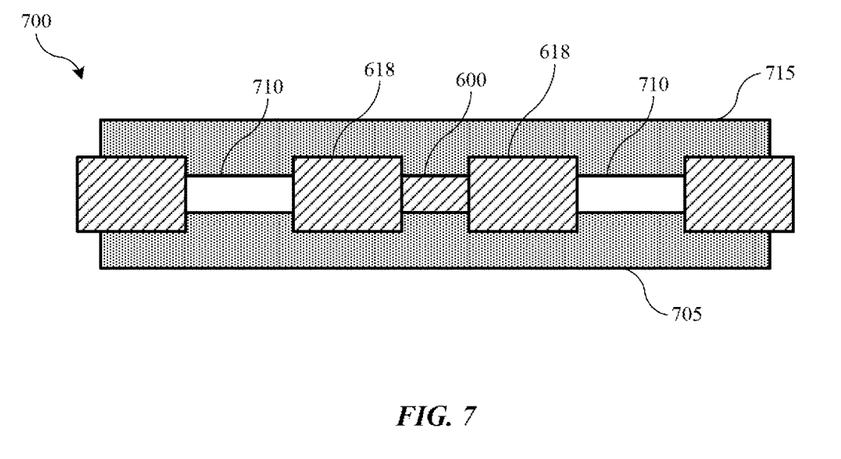
FIG. 7 shows a schematic cross-sectional view of a power module according to some embodiments of the present technology.

FIG. 7 shows a schematic cross-sectional view of a power module 700 according to some embodiments of the present technology. Power module 700 may include any of the components previously described, including a flex circuit board 600, and switches 710, which may include semiconductor structures as previously described. Power module 700 may include a direct bonded copper (DBC) substrate 705, or other thermal substrate, which may be used to form an electrical circuit with and cool associated components. A plurality of switches 710 may be seated overlying the DBC substrate 705. Flexible circuit board 600 may be positioned overlying the DBC substrate. Switches 710 may extend through apertures of the flexible circuit board 600.

As previously discussed, current sensors 618 may be included within flexible circuit board 600 about the defined apertures. The current sensors 618 may extend about switches 710 to measure current through each switch of the structure. The current sensors 618 may be Rogowski coils in some embodiments, which may allow the sensors to be positioned in plane with the switches extending through the flexible circuit board structure with which the sensors are associated. An additional DBC substrate 715 may be included within power module 700 overlying the switches 710 and flexible circuit board 600. The additional DBC substrate 715 may be positioned to contact a surface of each switch extending through the apertures of the flexible circuit board, while a surface of DBC substrate 705 contacts a surface of the switches opposite the surface contacting DBC substrate 715.

Figure 8:
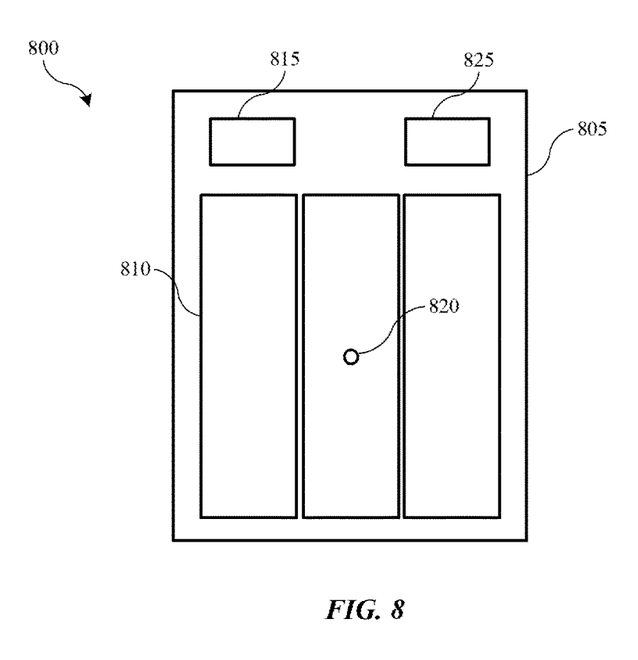
FIG. 8 shows a schematic plan view of a semiconductor device according to some embodiments of the present technology.

FIG. 8 shows a schematic plan view of a semiconductor device 800 according to some embodiments of the present technology, and which may represent a die for switches 710 previously described. Die 805 may include pad regions for providing electrical communication with aspects of the semiconductor device. For example, die 805 may include source pads 810 extending across the substrate. Additionally, die 805 may include gate pad 815 providing an electrical connection on the device for providing control and power for driving the gates of incorporated cells of the semiconductor device 800. Die 805 may include a sensor 820, such as a diode or other temperature sensor, formed within the source pads 810 of the semiconductor device. It is to be understood that sensor 820 may not be shown to scale, as for example, a diode may be less than a micrometer in lateral dimensions. Sensor 820 is included in the illustrated position merely for explanatory purposes.

Die 805 may also include a temperature pad 825 for receiving measurement information from sensor 820. Temperature pad 825 may reduce the available area on the die 805 for source pads 810, which may provide a less efficient design from a power perspective. However, although sacrificing an amount of space for the temperature pad 825, including temperature measurements directly within the semiconductor device structure as previously described may provide the temperature measurements utilized by the observer. Many conventional technologies may include a sensor separate from the die, which may be incapable of recognizing heat fluctuations occurring in a fraction of a second, such as from energy dissipation due to external shorts. Accordingly, because the conventional sensors may not register such an event, the semiconductor device may be damaged or failed without the temperature sensor registering an effect. Thus, despite the efficiency loss of incorporating a temperature pad on semiconductor device 800 by reducing the area for source pads, some embodiments of the present technology may provide a more protected and useful device over conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the cell" includes reference to one or more cells and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A power module comprising:
   a direct bonded copper substrate;
   a plurality of switches overlying the direct bonded copper substrate; and
   a flexible circuit board overlying the direct bonded copper substrate, wherein the flexible circuit board defines an aperture through the flexible circuit board for each switch of the plurality of switches, wherein the plurality of switches extend through corresponding apertures of the flexible circuit board, wherein a current sensor of a plurality of current sensors extends respectively about each aperture, and wherein the plurality of current sensors are configured to measure current through each switch of the plurality of switches.

2. The power module of claim 1, further comprising an additional direct bonded copper substrate overlying the flexible circuit board.

3. The power module of claim 2, wherein the additional direct bonded copper substrate contacts a surface of each switch extending through the apertures of the flexible circuit board.

4. The power module of claim 1, wherein each switch comprises a temperature sensing diode formed proximate a gate structure of the switch.

5. The power module of claim 4, further comprising an integrated circuit coupled with the flexible circuit board and configured to model a temperature distribution within each switch.

6. The power module of claim 5, wherein the model determines a temperature effect within each switch based on a switching loss current distribution.

7. The power module of claim 5, wherein the integrated circuit is configured to select a dI/dt by which an individual switch of the plurality of switches is configured to shut off to distribute current within regions of the switch.

8. The power module of claim 5, wherein the integrated circuit further comprises a selective gate drive electronically coupled with the current sensors and configured to drive a gate of a switch of the plurality of switches to a setpoint configured to provide a predetermined distribution of current within the switch.

9. The power module of claim 1, wherein each switch comprises a gate pad, a source pad, and a temperature pad communicatively coupled with a diode formed within the source pad.

10. The power module of claim 1, wherein the current sensors comprise Rogowski coils positioned in plane with the plurality of switches extending through the apertures.

* * * * *